United States Patent [19]
Yamamoto

[11] Patent Number: 5,658,658
[45] Date of Patent: Aug. 19, 1997

[54] MAGNETORESISTANCE EFFECT ELEMENTS AND METHOD OF FABRICATING THE SAME

[75] Inventor: Hidefumi Yamamoto, Tokyo, Japan

[73] Assignee: NEC Corporation, Tokyo, Japan

[21] Appl. No.: 242,626

[22] Filed: May 13, 1994

[30] Foreign Application Priority Data

May 13, 1993 [JP] Japan ................................. 5-110825
Nov. 17, 1993 [JP] Japan ................................. 5-288031

[51] Int. Cl.$^6$ ............................................. G11B 5/66
[52] U.S. Cl. ................... 428/332; 428/336; 428/668; 428/699; 428/670; 428/671; 428/672; 428/673; 428/674; 428/675; 428/678; 428/679; 428/680; 428/681; 428/694 R; 428/694 T; 428/694 TS; 428/694 TM; 428/900; 427/127; 427/128; 427/129; 427/130; 427/131; 427/132
[58] Field of Search .................. 428/694 R, 694 T, 428/694 TS, 694 TM, 900, 668, 669, 670, 671, 672, 673, 874, 675, 678, 679, 680, 681, 332, 336; 427/127, 128, 129, 130, 131, 132

[56] References Cited

U.S. PATENT DOCUMENTS 5,514,469  5/1996  Shinjo ................................ 428/332

FOREIGN PATENT DOCUMENTS

0483373  5/1992  European Pat. Off. .
4-218982  8/1992  Japan .

*Primary Examiner*—Leszek Kiliman
*Attorney, Agent, or Firm*—Sughrue, Mion, Zinn, Macpeak & Seas

[57] ABSTRACT

In an artificial superlattice magnetoresistance effect element in which two or more of magnetic thin film layers having different coercive forces are stacked with intervening of a non-magnetic film layer and resistance changes depending on directions of magnetization in adjacent magnetic thin film layers by utilizing differences in the coercive forces, an anisotropy magnetic field Hk is increased by reducing a thickness of a soft magnetic layer, anisotropy in the magnetic thin film layer is obtained by forming the magnetic thin film layer in a magnetic field to thus increase the Hk, a material having large Hk is used as a soft magnetic material for the soft magnetic layer, and further the anisotropy is obtained by reducing a pattern width into 1–30 µm to thus increase the Hk, whereby the resistance change is achieved in the neighborhood of a zero magnetic field and thus no bias mechanism is required.

20 Claims, 4 Drawing Sheets

MAGNETORESISTANCE EFFECT ELEMENTS AND METHOD OF FABRICATING THE SAME

BACKGROUND OF THE INVENTION

1. Field of the Invention

The present invention relates to a magnetoresistance effect element or magnetoresistive element for reading magnetic field intensity as signals in a magnetically recorded medium and a method of fabricating the same, and in more particular to a magnetoresistance effect element which is fabricated with a magnetoresistive film having high rate of change in resistance in a small external magnetic field and a method of fabricating the same.

2. Disclosure of the Related Art

In these years, in association with an advance in a high sensitivity in magnetic field sensors and a high density in magnetic recordings, the development of magnetic field sensors of magnetoresistance effect type (hereinafter referred to as "MR sensor") and magnetic heads of magnetoresistance effect type (hereinafter referred to as "MR head") arises increasingly. The MR sensor and MR head read external magnetic signals through the resistance change in a reading sensor part comprising a magnetic material. However, in the MR sensor and MR head, the relative speed thereof with respect to a magnetic recording medium does not depend on a regenerative or reproducing output and thus the MR sensor achieves a high sensitivity and the MR head attains a high output even in case of a high density magnetic recording.

Recently, a magnetoresistance effect element comprising two or more of magnetic thin layers which are stacked with intervening a non-magnetic thin layer therebetween, wherein adjacent magnetic thin layers through the non-magnetic thin layer have different coercive forces and the element exhibits a large magnetoresistance change in a small external magnetic field, has been taught in Unexamined Japanese Patent Publication Hei 4-218982 (EP 0 483 373 A1). This magnetorsistance effect element has a high resistance change rate of several % to several tens % in a small external magnetic field of the order of several Oe to several tens Oe.

The magnetoresistance effect element as described in the above publication can be operated by application of the small external magnetic field. However, if the element is used for practical sensors and magnetic heads, it was necessary to set bias layers on the upper and lower sides of the element or to apply an external bias magnetic field thereto.

SUMMARY OF THE INVENTION

Accordingly, an object of the present invention is to provide a magnetoresistance effect element in which the resistance change is achieved in the neighborhood of zero magnetic field even if bias mechanism does not exist.

According to an aspect of the present invention, there is provided a magnetoresistance effect element comprising a substrate and a plurality of layers of magnetic thin films which are stacked with intervening a layer of a non-magnetic thin film therebetween on the substrate, adjacent magnetic thin film layers through the non-magnetic thin film layer having different coercive forces, wherein a coercive force $Hc_2$ of one layer of the adjacent magnetic thin film layers, a coercive force $Hc_3$ of another layer of the adjacent magnetic thin film layers ($0<Hc_2<Hc_3$) and an anisotropy magnetic field $Hk_2$ in a direction of a signal magnetic field which is applied to the magnetic thin film layer having the coercive force $Hc_2$ satisfy an inequality: $Hc_2<Hk_2<Hc_3$.

According to another aspect of the present invention, there is a method of fabricating the above-mentioned magnetoresistance effect element in which a plurality of layers of magnetic thin films having different coercive forces are stacked with intervening of a layer of a nonmagnetic thin film therebetween on a substrate, comprising forming the magnetic thin film layers in a magnetic field so that an easy axis in each of the magnetic thin film layers is perpendicular to a direction of a signal magnetic field to be applied and so that a coercive force $Hc_2$ of one layer of the adjacent magnetic thin film layers, a coercive force $Hc_3$ of another layer of the adjacent magnetic thin film layers ($0<Hc_2<Hc_3$) and an anisotropy magnetic field $Hk_2$ in a direction of a signal magnetic field which is applied to the magnetic thin film layer having the coercive force $Hc_2$ satisfy an inequality: $Hc_2<Hk_2<Hc_3$.

The foregoing and other objects and features of this invention will be apparent from the following description.

DETAILED DESCRIPTION OF THE PREFERRED EMBODIMENTS

The present invention will be hereinafter described in more detail with reference to the accompanying drawings.

A kind of the magnetic material to be used as the magnetic thin film in the present invention is not particularly limited. Preferred examples are Fe, Ni, Co, Mn, Cr, Dy, Er, Nd, Tb, Tm, Ce, Gd and the like. As alloys or compounds comprising such element, for instance, Fe—Si, Fe—Ni, Fe—Co, Fe—Gd, Ni—Fe—Co, Ni—Fe—Mo, Fe—Al—Si(Sendust etc.), Fe—Y, Fe—Mn, Cr—Sb, Co base amorphous alloys, Co—Pt, Fe—Al, Fe—C, Mn—Sb, Ni—Mn, Co—O, Ni—O, Fe—O, Ni—F, ferrites and the like are preferred.

In the present invention, two or more magnetic materials having different coercive forces are selected from the above-mentioned materials to form the magnetic thin film layers. Particularly, the present invention is realized by selecting, as the material having smaller coercive force of the above two materials different coercive force, the materials having an anisotropy magnetic field larger than the coercive force.

The anisotropy magnetic field can be increased, for instance, by thinning a thickness of the film. For instance, the anisotropy magnetic field Hk larger than the coercive force Hc can be achieved by obtaining a NiFe film having a thickness of the order of 8–15 angstroms.

In general, if the width of a magnetic thin film is reduced by patterning, shape anisotropy Hd due to a diamagnetic field appears. This shape anisotropy Hd is in inverse proportion to the pattern width W and thus increases as the pattern width gets narrower. In an artificial superlattice magnetic thin layer, such shape anisotropy Hd appears in the same manner as mentioned above. Furthermore, in the artificial superlattice layer, the magnetic layer and non-magnetic layer are stacked alternately and the magnetic thin layers are magnetostatically connected to one another at the ends. The magnetostatic connection is influenced considerably as the pattern width W Gets narrower. In fact, a magnetic field region, at which the magnetization in the magnetic thin layer is inverted, is shifted depending on these influences by making the pattern width W narrower and thus it is possible to achieve the anisotropy magnetic field Hk larger than the coercive force Hc.

The above-mentioned magnetorsistance effect element can be fabricated by forming the above magnetic thin film layers in a magnetic field so that an easy axis of each magnetic thin film layer is perpendicular to a direction of a signal magnetic field to be applied and so that the coercive forces $Hc_2$ and $Hc_3$ and anisotropy magnetic field $Hk_2$ of the respective adjacent magnetic thin film layers in the direction of the signal magnetic field to be applied satisfy an inequality: $Hc_2 < Hk_2 < Hc_3$.

The thin film layer may be formed by vapor deposition, sputtering, molecular beam epitaxy (MBE) and the like. As the substrate, glass, silicon, MgO, GaAs, ferrite, CaTiO and the like can be used.

The upper limit of a thickness of each magnetic thin film layer is about 200 angstroms, while the lower limit of the layer thickness is not specially limited. However, if the layer thickness is less than 4 angstroms, a Curie temperature is lower than room temperature so that the element cannot be practically used. If the layer thickness is 4 angstroms or more, the layer thickness can be easily made uniform, a layer quality is improved and saturation magnetization is not excessively decreased. Though the effect is not deteriorated when the layer thickness is more than 200 angstroms, it is not increased as the layer thickness increases, and the production of such thick layer is wasteful and uneconomical.

The coercive force of each magnetic layer varies with the intensity of the external magnetic field applied to the element or the required resistance change rate and is conveniently selected from the range, for instance, between about 0.001 Oe and about 10 kOe. A ratio of the coercive forces of the adjacent magnetic thin film layers is from 1.2:1 to 100:1, preferably from 5:1 to 50:1, more preferably from 8:1 to 20:1.

Since the magnetic characteristics of each magnetic thin layer present in the magnetoresistance effect element cannot be directly measured, in general, they are measured as follows:

The magnetic thin film layers to be measured are vapor deposited alternately with the non-magnetic thin film layers till the total thickness reaches about 200 to 400 angstroms to produce a sample for measurement, and its magnetic characteristics are measured. In this case, the thickness of each magnetic thin layer, the thickness of each non-magnetic thin layer and the composition of the non-magnetic thin layer are the same as those in the magnetoresistance effect element.

The non-magnetic thin layer acts as a material for decreasing a magnetic interaction between the magnetic thin layers having the different coercive forces and its kind is not particularly limited. The non-magnetic material can be selected from various metallic or semimetallic non-magnetic materials or non-metallic non-magnetic materials.

Preferred examples of the metallic non-magnetic material are Au, Ag, Cu, Pt, Al, Mg, Mo, Zn, Nb, Ta, V, Hf, Sb, Zr, Ga, Ti, Sn, Pb or their alloys. Preferred examples of the semimetallic non-magnetic material are Si, Ge, C, B and a composite or mixture material of at least one of these elements and other element. Preferred examples of the nonmetallic non-magnetic material are $SiO_2$, SiO, SiN, $Al_2O_3$, ZnO, MgO, TiN and a composite or mixture material of at least one of these materials and other element.

It is preferred that a thickness of the non-magnetic thin layer is not more than 200 angstroms. If this thickness exceeds 200 angstroms, the strength of the resistance is determined by the non-magnetic thin layer or layers, so that the scattering effect depending on spins is relatively reduced and then the magnetoresistance change rate is decreased. If this thickness is less than 4 angstroms, the magnetic interaction between the magnetic thin layers becomes too large and it is impossible to avoid generation of magnetically direct contact state (pinholes) because it is difficult to generate an antiparallel state in the directions of the magnetization of the adjacent magnetic thin layers.

The thickness of each of the magnetic and non-magnetic thin layers can be measured by a transmittance electron microscope, a scanning electron microscope, Auger electron spectroscopy and the like. A crystal structure of the thin layer can be identified by X-ray diffraction, high-energy electron diffraction such as reflection high-energy electron diffraction(RHEED) and the like.

In the magnetoresistance effect element according to the present invention, the number of the laminated or stacked artificial superlattice layers N is not critical, and is conveniently determined according to the desired magnetoresistance change rate and the like. To obtain a sufficient magnetoresistance change rate, N is preferably at least 2. As the number of the laminated layers increases, the resistance change rate increases though the productivity decreases. When N is too large, the resistance of the whole element excessively decreases so that the practical use of the element may be difficult. In general, N is 50 or less.

In the above discussion, two magnetic thin film layers having different coercive forces are used. It is possible to use three or more magnetic thin film layers having different coercive forces, whereby two or more external magnetic fields at which the directions of the magnetization are inverted can be set, so that a range of acting magnetization strength can be increased.

On the surface of the uppermost magnetic thin layer, an oxidation-inhibiting film made of, for instance, silicon nitride or silicon oxide may be provided, or a metallic conductive film for the formation of an electrode may be provided.

Figure 1:
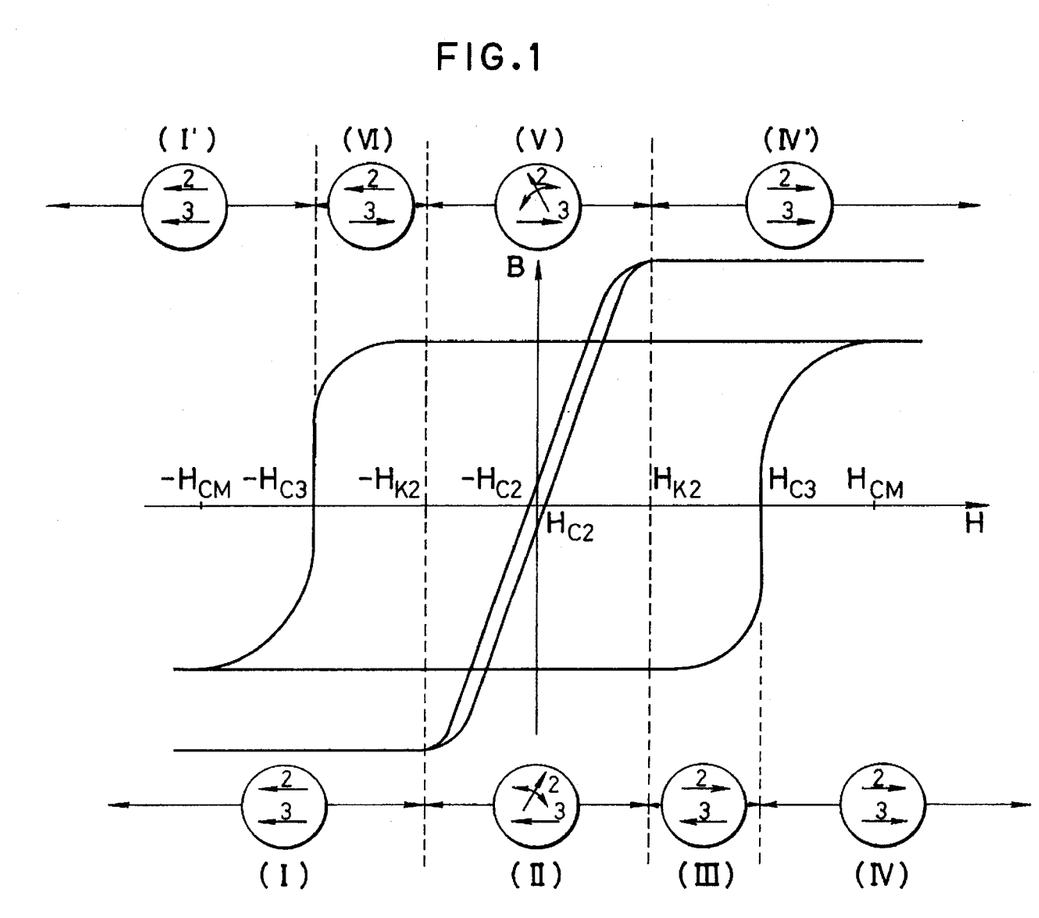
FIG. 1 is a schematic B–H curve which explains function principles of a magnetoresistance effect element according to the present invention.

In the magnetoresistance effect element according to the present invention, it is essential that the adjacent magnetic thin layers through the non-magnetic thin layer have different coercive forces, because the principle of the present invention is based on the fact that, when the directions of the magnetization in the adjacent magnetic thin layers are opposite each other, the element has the largest resistance. Namely, in the present invention, as shown in FIG. 1, when an external magnetic field lies between the coercive force $Hc_2$ of one magnetic thin layer and the coercive force $Hc_3$ of another magnetic thin layer ($Hc_2 < H < Hc_3$), the directions of the magnetization in the adjacent magnetic thin layers are opposite each other so that the resistance increases.

In addition, it is essential that the anisotropy magnetic field $Hk_2$ is larger than the coercive force $Hc_2$. However, it is not preferred that $Hk_2$ is larger than the coercive force $Hc_3$ because the directions of the magnetization in the magnetic thin layers cannot lie in an antiparallel state and thus the sufficient resistance change cannot be achieved.

Now, the relationship among the external magnetic field, the coercive force and the directions of the magnetization is explained.

For simplicity, the explanation will be made by making reference to an element including two magnetic thin layers 2 and 3 having different coercive forces through the non-magnetic thin layer.

As shown in FIG. 1, the coercive forces Hc of two magnetic layers are $Hc_2$ and $Hc_3$ ($0<Hc_2<Hc_3$), and saturation magnetic field (or apparent saturation magnetic field) in the magnetic thin layer 2 is $Hk_2$ ($0<Hc_2<Hk_2<Hc_3$).

First, the external magnetic field H is applied so that H is smaller than $-Hcm$ (Hcm being an external magnetic field at which the magnetization of the magnetic thin layer 3 is saturated). In this state, the directions of the magnetization of the magnetic thin layers 2 and 3 are in the same negative (−) direction as that of H (I).

Next, as the external magnetic field is reduced, in the region (II) wherein $-Hk_2<H<Hk_2$, the magnetization in the magnetic thin layer 2 rotates continuously, and in the region (III) wherein $Hk_2<H<Hc_3$, the direction of the magnetization in the layer 2 is completely inverted. Thus, the directions of the magnetization in the layers 2 and 3 are opposite each other.

As the external magnetic field is increased to the region (IV) wherein $Hc_3<H$, the direction of the magnetization of the magnetic thin layer 3 is inverted so that the directions of the magnetization of the magnetic thin layers 2 and 3 are both in the positive(+) direction.

Figure 2:
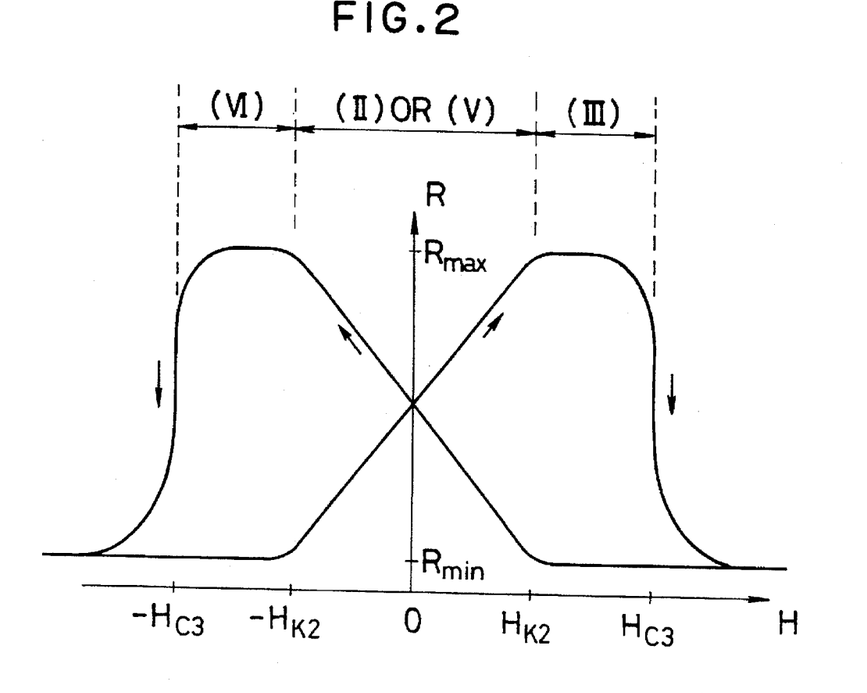
FIG. 2 is a schematic MR curve which explains function principles of a magnetoresistance effect element according o the present invention.

Thereafter, when the external magnetic field H is decreased, in the region (IV') wherein $Hk_2<H$, the directions of the magnetization of the both magnetic thin layers 2 and 3 are still in the positive direction, but in the region (V) wherein $-Hk_2<H<Hk_2$, the magnetization of the magnetic thin layer 2 rotates continuously and in the region (VI) wherein $-Hc_3<H<-Hk_2$, the direction of the magnetization of the magnetic thin layer 2 is completely inverted so that the directions of the magnetization of the magnetic thin layers 2 and 3 are opposite each other. Furthermore, in the region (I') wherein $H<-Hc_3$, the magnetization of the magnetic thin layer 3 rotates and the directions of the magnetization of the magnetic thin layers 2 and 3 are both in one direction. Resistance of the layers changes depending on the relative directions of the magnetization of the magnetic thin layers 2 and 3. In the regions (II) and (V), the resistance changes linearly in the neighborhood of a zero magnetic field. In the regions (III) and (VI), the resistance reaches the maximum value (Rmax). The results are shown in FIG. 2.

In the above layers, since there is achieved a resistance change having good linearity in the neighborhood of a zero magnetic field, the artificial superlattice magnetoresistance effect element thus fabricated requires no bias mechanism.

The magnetoresistance effect element of the present invention will be illustrated by making reference to the accompanying drawing.

Figure 3:
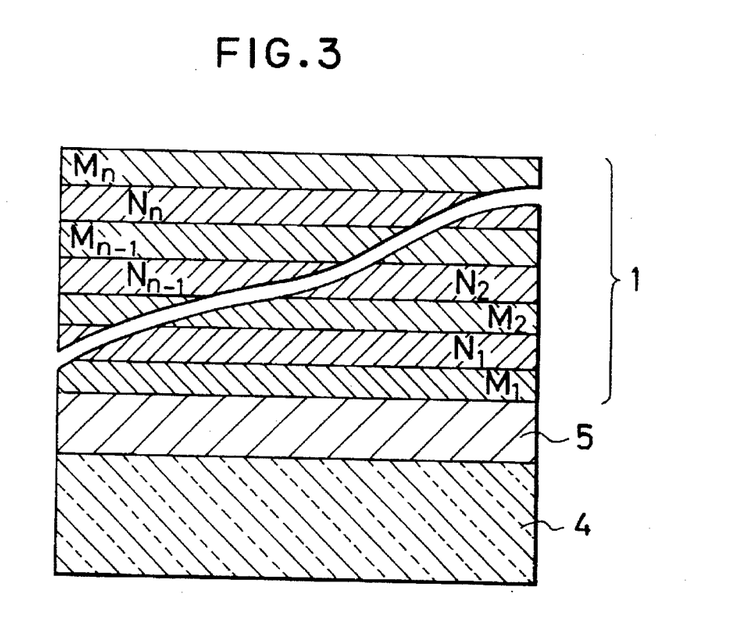
FIG. 3 is a partially omitted and schematically cross-sectional view of a magnetoresistance effect element according to the present invention.

Referring now to FIG. 3, there is shown a partially omitted and schematically cross-sectional view of an example of an artificial superlattice film 1 in the present invention. In FIG. 3 the artificial superlattice film 1 has magnetic thin film layers $M_1, M_2, ---, M_{n-1}$ and $M_n$ on a substrate 4 through a metallic thin layer 5 and, between adjacent two magnetic thin film layers, non-magnetic thin layers $N_1, N_2, ---, N_{n-2}$ and $N_{n-1}$.

The present invention will be concretely explained by the accompanying drawings and the non-limitative examples (including control example) based on experimental results.

EXAMPLE 1

A glass plate 4 as a substrate was placed in an ultrahigh vacuum deposition apparatus and the apparatus was evacuated to $10^{-5}$–$10^{-10}$ Torr. While rotating the substrate which was kept at room temperature, a chromium thin layer having a thickness of 50 angstroms as a metallic thin layer 5 was formed and then an artificial superlattice film 1 having the following composition was formed thereon. The superlattice film 1 was grown at a rate of about 0.3 angstroms/sec.
Composition of artificial superlattice film:
Cr(50)/[NiFe(8)/Cu(55)/Co(10)/Cu(55)]×5 ($MR_{ratio}$=5.5%)
Cr(50)/[NiFe(10)/Cu(55)/Co(10)/Cu(55)]×5 ($MR_{ratio}$= 6.0%)
Cr(50)/[NiFe(15)/Cu(55)/Co(10)/Cu(55)]×5 ($MR_{ratio}$= 6.5%)
Cr(50)/[NiFe(25)/Cu(55)/Co(10)/Cu(55)]×5 ($MR_{ratio}$= 6.1%)

In the above compositions, when the composition is expressed, for instance, as Cr(50)/[NiFe(10)/Cu(55)/Co(10)/Cu(55)]×5, it means that after the Cr thin layer having a thickness of 50 angstroms was formed on the glass substrate, a thin layer of an alloy of 80% Ni and 20% Fe having a thickness of 10 angstroms, a Cu thin layer having a thickness of 55 angstroms, a Co thin layer having a thickness of 10 angstroms and a Cu thin layer having a thickness of 55 angstroms were successively deposited and the deposition of these layers was repeated five times.

The magnetization was measured by a vibrating sample magnetometer. The dimension of the sample for MR measurement was 0.3×10 mm. While applying the external magnetic field in an in-plane direction perpendicular to a direction of an electric current, the resistance was measured by a four prove method by changing the external field from −500 to 500 Oe. and the magnetoresistance change rate $\Delta R/R$ was calculated from the measured resistances. The magnetoresistance ratio $\Delta R/R$ was calculated according to the following equation:

$$\frac{\Delta R}{R} = \frac{Rmax - Rmin}{Rmin} \times 100\ (\%)$$

wherein Rmax is the maximum resistance and Rmin is the minimum resistance.

Figure 4:
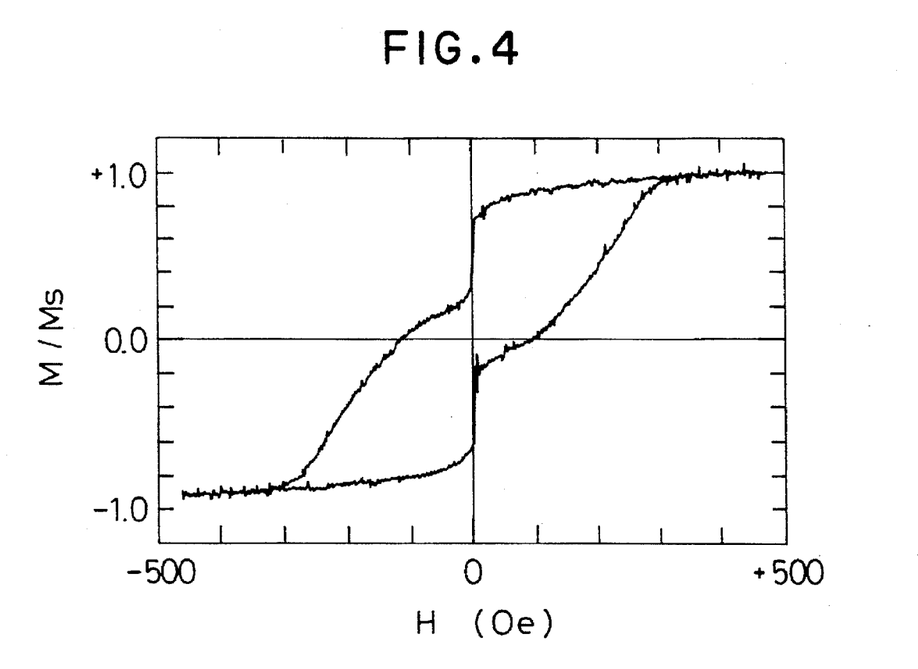
FIG. 4 is a schematic B–H curve of an artificial superlattice film in a magnetoresistance effect element according to the present invention.
Figure 5:
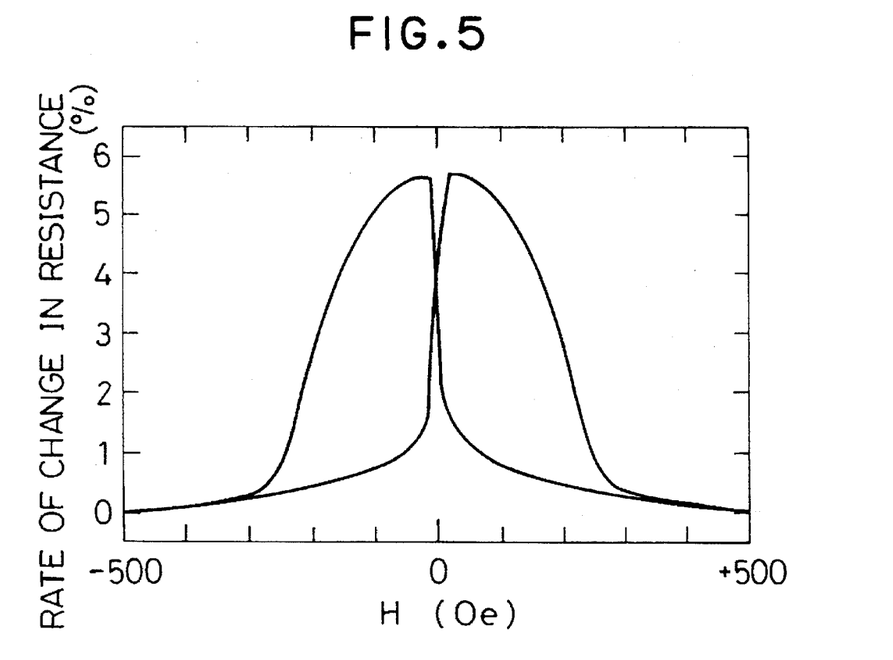
FIG. 5 is a schematic MR curve of an artificial superlattice film in a magnetoresistance effect element according to the present invention.

In the above artificial superlattice film which includes the soft magnetic NiFe layer having a thickness of from 8 to 15 angstroms, the soft magnetic NiFe layer has an anisotropy magnetic field Hk larger than the coercive force Hc. A B–H curve and a MR curve of this artificial superlattice film are shown in FIGS. 4 and 5, respectively. It was shown that resistance of the film changed linearly in the neighborhood of a zero magnetic field. In the sample in which the NiFe layer is 25 angstroms thick, the anisotropy magnetic field Hk of the NiFe layer was approximately equal to the coercive force Hc. In the film thus obtained, the resistance thereof did not change linearly in the neighborhood of a zero magnetic field.

EXAMPLE 2

In the same manner as in Example 1, an artificial superlattice film having the following composition: Cr(50)/[NiFe (20)/Cu(35)/Co(20)/Cu(35)]×5 (MR$_{ratio}$=11%) was produced. An Au layer having a thickness of 2400 angstroms for use in an electrode was deposited thereon.

Then, resist was coated on the Au layer and was subjected to a fine processing with a dry etching apparatus to form MR patterns having various MR pattern widths. Therefore, the Au layer located at an MR sensing portion was removed to obtain samples for measuring the magnetic resistance thereof. The sensing portion of the artificial superlattice film for measurement has the size of 3×200 μm, 5×200 μm, 10×200 μm.

Figure 6A:
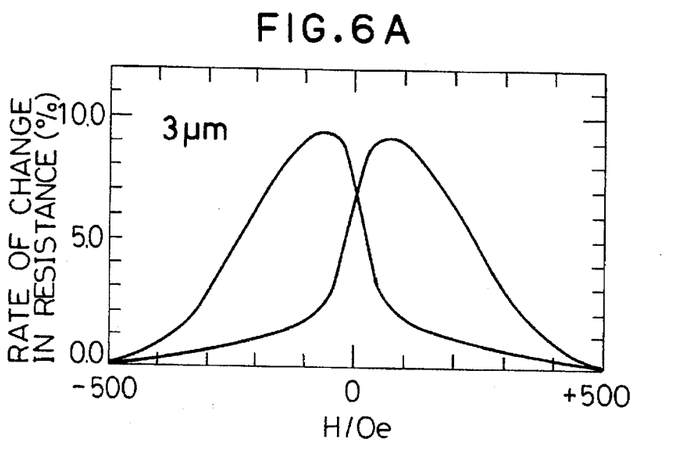
FIGS. 6A, 6B and 6C are schematic MR curves of artificial superlattice films in a magnetoresistance effect element according to the present invention, respectively.
Figure 6B:
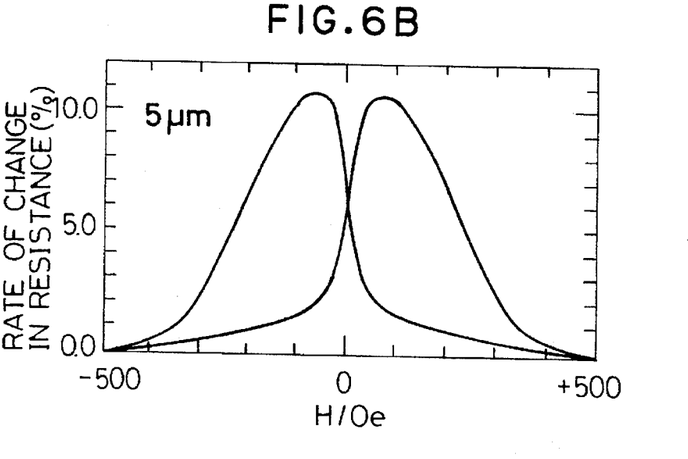
Figure 6C:
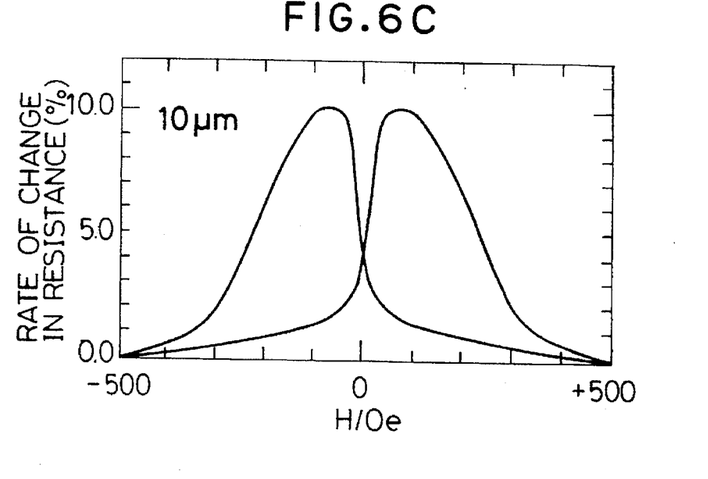

In the artificial superlattice film having the MR pattern width of 30 μm or less, an apparent anisotropy magnetic field Hk of the NiFe layer is larger than the coercive force depending on the influence of a diamagnetic field of the film and a magnetostatic interaction between the respective magnetic layers in the artificial superlattice film. MR curves of these three artificial superlattice films are shown in FIGS. 6A, 6B and 6C, respectively. As seen from these curves, the resistance of each film changed linearly in the neighborhood of a zero magnetic field. In the sample having the MR pattern width of 30 μm or more, since the influence of a diamagnetic field and magnetostatic connection is relatively small, the apparent anisotropy magnetic field Hk of the NiFe layer is approximately equal to the coercive force Hc and thus the resistance of the sample did not change linearly in the neighborhood of a zero magnetic field.

EXAMPLE 3

In general, it is known that in a NiFe film, uniaxial anisotropy appears on application of a magnetic field in the course of deposition. If an external magnetic field is applied to the hard axis of magnetization in the NiFe film having the uniaxial anisotropy which appeared on application of the magnetic field in the course of deposition, a B–H curve of this NiFe layer has such a magnetic hysteresis that an anisotropy magnetic field Hk is larger than a coercive force Hc. Therefore, even in the artificial superlattice film in which the direction of application of the external magnetic field lies in the hard axis of magnetization due to deposition in the magnetic field, the resulting magnetoresistance effect element has linear change in resistance in the neighborhood of the zero magnetic field.

In this example, SmCo magnets were placed on both sides of a glass substrate and deposition of an artificial superlattice film was performed in such a state that an external magnetic field of the order of several tens Oe was applied in parallel to the glass substrate. The measurement of a B–H curve on this sample showed that the direction of application of the magnetic field in the course of deposition lies in an easy axis of magnetization in an artificial superlattice NiFe layer and the anisotropy magnetic field Hk is not very large as compared with the coercive force Hc. However, a direction perpendicular to the direction of application of the magnetic field in the course of deposition lies in the hard axis of magnetization. Thus, if the external magnetic field is applied to the direction of the hard axis of magnetization, resistance of the film changed linearly in the neighborhood of the zero magnetic field.

The anisotropy magnetic field Hk and the coercive force Hc change depending on magnetic characteristics and anisotropy coefficient of magnetic materials to be used. A NiFeMo material has extremely excellent soft magnetic characteristics as compared with the NiFe material. In addition, the coercive force of the former is better than in the latter. Thus, in the NiFeMo material, the anisotropy magnetic field Hk is larger than the coercive force Hc. For this reason, in an artificial superlattice film having a composition: Cr(50)/[NiFeMo(20)/Cu(55)/Co(20)/Cu(55)]×5 (MR$_{ratio}$=6.5%), there was fabricated a magnetoresistance effect element of which resistance changed linearly in the neighborhood of the zero magnetic field and which required no bias mechanism.

As discussed above, the artificial superlattice magnetoresistance effect element according to the present invention requires no bias mechanism and attains high reliability.

While this invention has been described in connection with certain preferred embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

What is claimed is:

1. A magnetoresistance effect element comprising a substrate and a plurality of layers of magnetic thin films and non-magnetic thin films which are stacked alternately on said substrate, adjacent ones of said magnetic thin film layers having a non-magnetic thin film layer therebetween and having different coercive forces, wherein a coercive force Hc$_2$ of one layer adjacent magnetic thin film layers, a coercive force Hc$_3$ of the other layer of said adjacent magnetic thin film layers (O<Hc$_2$<Hc$_3$), and an anisotropy magnetic field Hk$_2$, in a direction of a signal magnetic field which is applied to the magnetic thin film layer having said coercive force Hc$_2$, satisfy an inequality: Hc$_2$<Hk$_2$<Hc$_3$.

2. The magnetoresistance effect element as defined in claim 1, wherein a pattern width of said magnetoresistance effect element is of the order of 1–30 μm.

3. The magnetoresistance effect element as defined in claim 1, wherein each of said magnetic thin film layers is formed from at least one magnetic material selected from the group consisting of Fe, Ni, Co, Mn, Cr, Dy, Er, Nd, Tb, Tm, Ce, Gd and their alloys and compounds.

4. The magnetoresistance effect element as defined in claim 3, wherein said alloy or compound are selected from the group consisting of Fe—Si, Fe—Ni, Fe—Co, Fe—Gd, Ni—Fe—Co, Ni—Fe—Mo, Fe—Al—Si, Fe—Y, Fe—Mn, Cr—Sb, Co base Fe—Al, Fe—C, Mn—Sb, Ni—Mn, Co—O, Ni—O, Fe—O, Ni—F, ferrites amorphous alloys, Co—Pt, Fe—Al, Fe—C, Mn—Sb, Ni—Mn, Co—O, Ni-O, Fe-O, Ni-F and ferrites.

5. The magnetoresistance effect element as defined in claim 1, wherein a main component in said magnetic thin film layer having the coercive force Hc$_2$ is selected from the group consisting of Ni—Fe alloy, Ni—Fe—Mo alloy and an alloy thereof.

6. The magnetoresistance effect element as defined in claim 2, wherein a main component in the magnetic thin film layer having the coercive force Hc$_2$ is selected from the group consisting of Ni—Fe alloy, Ni—Fe—Mo alloy and an alloy of said Ni—Fe alloy and said Ni—Fe—Mo alloy.

7. The magnetoresistance effect element as defined in claim 1, wherein each of said magnetic thin film layers has a thickness of not more than 200 angstroms.

8. The magnetoresistance effect element as defined in claim 7, wherein a thickness of each of said magnetic thin film layers is at least 4 angstroms.

9. The magnetoresistance effect element as defined in claim 1, wherein each of said magnetic thin film layers has a coercive force of 0.001 Oe–10 kOe.

10. The magnetoresistance effect element as defined in claim 1, wherein a ratio of said coercive forces in said adjacent magnetic thin film layers is in a range of 1.2:1–100:1.

11. The magnetoresistance effect element as defined in claim 1, wherein a ratio of said coercive forces in said adjacent magnetic thin film layers is in a range of 5:1–50:1.

12. The magnetoresistance effect element as defined in claim 1, wherein a ratio of said coercive forces in said adjacent magnetic thin film layers is in a range of 8:1–20:1.

13. The magnetoresistance effect element as defined in claim 1, wherein said non-magnetic thin film layer is formed from at least one metallic non-magnetic material selected from the group consisting of Au, Ag, Cu, Pt, Al, Mg, Mo, Zn, Nb, Ta, V, Hf, Sb, Zr, Ga, Ti, Sn, Pb and an alloy thereof.

14. The magnetoresistance effect element as defined in claim 1, wherein said non-magnetic thin film layer is formed from at least one semimetallic non-magnetic material selected from the group consisting of Si, Ge, C, B and a composite material of at least one semimetallic non-magnetic material included in said group and another element.

15. The magnetoresistance effect element as defined in claim 1, wherein said non-magnetic thin film layer is formed from at least one non-metallic non-magnetic material selected from the group consisting of $SiO_2$, SiO, SIN, $Al_2O_3$, ZnO, MgO, TiN and a composite material of a least one non-metallic non-magnetic material included in said group and another element.

16. The magnetoresistance effect element as defined in claim 1, wherein said non-magnetic thin film layer has a thickness of not more than 200 angstroms.

17. The magnetoresistance effect element as defined in claim 16, wherein a thickness of said non-magnetic thin film layer is at least 4 angstroms.

18. The magnetoresistance effect element as defined in claim 1, wherein said plurality of magnetic thin film layers and non-magnetic thin film layers form an artificial superlattice film, said non-magnetic thin film layers comprising Cu, one layer of an adjacent pair of magnetic thin film layers being one of a NiFe layer and a NiFeMo layer and the other layer of said adjacent pair of magnetic thin film layers being a Co layer; wherein said artificial superlattice film is deposited on said substrate through a metallic thin layer and have a composition selected from the group consisting of
NiFe(8)/Cu(55)/Co(10)/Cu(55)
NiFe(10)/Cu(55)/Co(10)/Cu(55)
NiFe(15)/Cu(55)/Co(10)/Cu(55)
NiFe(25)/Cu(55)/Co(10)/Cu(55)
NiFe(20)/Cu(35)/Co(20)/Cu(35)
NiFeMo(20)/Cu(55)/Co(20)/Cu(55).

19. A method of fabricating a magnetoresistance effect element in which a plurality of magnetic thin film layers and a plurality of non-magnetic thin film layers are stacked alternately on a substrate, adjacent ones of said magnetic thin film layers having a non-magnetic thin film layer therebetween and having different coercive forces, said method comprising the steps of:

forming said magnetic thin film layers in a magnetic field so that an easy axis in each magnetic thin film layer is perpendicular to a direction of a signal magnetic field to be applied and so that a coercive force $Hc_2$ of one layer of said adjacent magnetic thin film layers, a coercive force $Hc_3$ of the other layer of said adjacent magnetic thin film layers ($0<Hc_2<Hc_3$), and an anisotropy magnetic field $Hk_2$, in a direction of a signal magnetic field which is applied to the magnetic thin film layer having said coercive force $Hc_2$, satisfy an inequality: $Hc_2<Hk_2<Hc_3$.

20. The method of fabricating a magnetoresistance effect element as defined in claim 19, wherein said magnetoresistance effect element is etched into a pattern width of 1–30 μm so that a relation among said coercive forces $Hc_2$ and $Hc_3$ and said anisotropy magnetic field $Hk_2$ in said magnetic thin film layer having said coercive force $Hc_2$ satisfies an inequality: $Hc_2<Hk_2<Hc_3$.

* * * * *

UNITED STATES PATENT AND TRADEMARK OFFICE
CERTIFICATE OF CORRECTION

PATENT NO.   : 5,658,658
DATED        : August 19, 1997
INVENTOR(S)  : Hidefumi YAMAMOTO It is certified that error(s) appears in the above-identified patent and that said Letters Patent is hereby corrected as shown below:

Column 8, line 42, after "base" delete "Fe-Al, Fe-C, Mn-sb, Ni-Mn, Co-O, Ni-O, Fe-O, Ni-F, ferrites".

Signed and Sealed this

Thirtieth Day of December, 1997

*Attest:*

BRUCE LEHMAN

*Attesting Officer*      *Commissioner of Patents and Trademarks*